(12) United States Patent
Nagahashi

(10) Patent No.: US 7,460,373 B2
(45) Date of Patent: Dec. 2, 2008

(54) HEAT RADIATION DEVICE FOR MEMORY MODULE

(75) Inventor: Haruki Nagahashi, Tokyo (JP)

(73) Assignee: Elpida Memory, Inc., Tokyo (JP)

(*) Notice: Subject to any disclaimer, the term of this patent is extended or adjusted under 35 U.S.C. 154(b) by 0 days.

(21) Appl. No.: 11/780,923

(22) Filed: Jul. 20, 2007

(65) Prior Publication Data
US 2008/0013284 A1 Jan. 17, 2008

Related U.S. Application Data

(63) Continuation of application No. 10/958,700, filed on Oct. 5, 2004, now Pat. No. 7,257,002.

(30) Foreign Application Priority Data

Oct. 6, 2003 (JP) .............. 2003-347404

(51) Int. Cl.
H05K 7/20 (2006.01)
F28F 7/00 (2006.01)
H01L 23/34 (2006.01)

(52) U.S. Cl. .............. 361/704; 165/80.3; 165/185; 257/719; 361/710; 361/719

(58) Field of Classification Search .............. None
See application file for complete search history.

(56) References Cited

U.S. PATENT DOCUMENTS

| 5,323,292 A | 6/1994 | Brezinkski |
| 5,424,919 A | 6/1995 | Hielbronner |
| 6,005,771 A | 12/1999 | Bjorndahl et al. |
| 6,370,025 B1 | 4/2002 | Yasufuku et al. |
| 6,421,240 B1 | 7/2002 | Patel |
| 6,424,532 B2* | 7/2002 | Kawamura .............. 361/708 |
| 6,496,375 B2 | 12/2002 | Patel et al. |

(Continued)

FOREIGN PATENT DOCUMENTS

JP 6194399 5/1986

(Continued)

OTHER PUBLICATIONS

Japanese Office Action dated Oct. 19, 2005 for corresponding Japanese Application 2003-347404, with partial translation.

Primary Examiner—Gregory D Thompson
(74) Attorney, Agent, or Firm—Katten Muchin Rosenman LLP

(57) ABSTRACT

There is disclosed a heat radiation device for memory modules intended for radiating heat that is generated from a memory module group wherein a plurality of memory modules equipped with memory elements on both the front and rear face sides of a substrate are placed in parallel. The device comprises heat radiation plates in pairs composed of front face side heat radiation plates in contact with memory elements that are installed on the front face side of the substrate for each of the memory modules, and of rear face side heat radiation plates in contact with memory elements that are installed on the rear face side of the substrate; and connecting members for heat radiation plates in pairs which connect the heat radiation plates in pairs so that heat is conducted among a plurality of the heat radiation plates in pairs.

19 Claims, 7 Drawing Sheets

U.S. PATENT DOCUMENTS 6,775,139 B2 8/2004 Hsueh
6,934,152 B1 * 8/2005 Barrow .................. 361/690

FOREIGN PATENT DOCUMENTS

| JP | 5235255 | 9/1993 |
| JP | 9129817 | 5/1997 |
| JP | 10335546 | 12/1998 |
| JP | 2000164792 | 6/2000 |
| JP | 2001118984 | 4/2001 |
| JP | 2002093988 | 3/2002 |
| JP | 2002110869 | 4/2002 |

* cited by examiner

HEAT RADIATION DEVICE FOR MEMORY MODULE

BACKGROUND OF THE INVENTION

1. Field of the Invention

The present invention relates to a heat radiation device for memory modules which radiates heat that is generated from memory elements of each of the modules to cool the memory elements, in cases where a plurality of semiconductor memory modules, wherein a plurality of memory elements are installed on a memory substrate (hereinafter sometimes abbreviated to "module"), are placed in parallel on a mother board or the like to form a module group. The above-mentioned semiconductor memory modules are shown as an example, by DIMM (Dual Inline Memory module) wherein a plurality of SDRAM (Synchronous Dynamic Access Memory) are arranged on a memory substrate.

2. Description of the Related Art

An example of a module group is shown in FIG. 1. Module group 2 shown in FIG. 1 consists of three modules 2a to 2c. Each of modules 2a to 2c has memory substrate 3 and a plurality of (generally 16 numbers) memory elements 4 that are arranged along the longitudinal direction of substrate 3 on both front and rear face sides thereof. Memory substrate 3 for each of modules 2a to 2c is inserted into connector 5 placed at a constant spacing.

Heat generated from memory elements 4 installed on each of modules 2a to 2c is radiated through heat radiation and convection from the surfaces of memory elements 4, and this heat is conducted to mother board 1 via memory substrate 3 and connector 5, and is radiated from the surfaces of mother board 1 as well. In FIG. 1, heat radiation from the surfaces of memory elements 4, convection therefrom and heat radiation through mother board 1 are schematically shown by arrows X, Y and Z, respectively. Japanese laid-open patent publication No. 94399/1986 (Showa 61) discloses a circuit module which enhances the heat radiation effect by extending the peripheries of a circuit chip or circuit board each corresponding to memory substrate 3 shown in FIG. 1, up to the external portion of that case that accommodates the above-mentioned chip or board.

Moreover in the case of RIMM (Rambus In-line memory Module) wherein a plurality of memory elements that are installed on memory substrates function one by one, the load and heat generation per each memory element increase as compared with other memory modules wherein a plurality of memory elements function simultaneously. Thus as shown in FIG. 2, heat radiation plates 6 which radiate heat generated from memory elements 4 in the longitudinal direction of memory substrate 3 are installed on each of modules 2a to 2c. Heat radiation plates 6 are arranged so as to encompass memory elements 4 on both front and rear face side of memory substrate 3 for each of modules 2a to 2c, and are in contact with opposing memory elements 4. Accordingly, heat generated from a memory element which was installed on memory substrate is dispersed in longitudinal direction of said memory substrate via heat radiation plate 6 with which the memory element comes in contact, and is radiated from the surface of the heat radiation plate 6.

It is difficult to maintain module temperature at a stipulated value or lower by heat radiation realized by the structure as shown in FIG. 1. In particular, with regard to central module 2b among the three modules 2a to 2c shown in FIG. 1, the convectional heat radiation effect is lowered by barriers due to modules 2a and 2c both of which are on the outside of module 2b. Further, since module 2b receives heat from memory elements 4 installed on modules 2a and 2c both on the outside of module 2b, its temperature tends to be increased as compared with modules 2a, 2c.

In addition, the structure as shown in FIG. 2 may or may not uniformize the temperature difference among modules 2a to 2c, but the temperature difference among a plurality of adjacent modules is not uniformized. In particular, the temperature raising tendency of central module 2b among the three modules 2a to 2c is the same as that in the structure shown in FIG. 1. In fact, three modules 2a to 2c shown in FIG. 2 were made to function simultaneously, and the temperatures thereof were measured. As a result, the highest temperature of central module 2b was 67.2° C., while that of modules 2a, 2c, both on the outside was, 61.6° C., thereby causing a temperature difference of 5.0° C. or higher.

As mentioned above, in the case where a plurality of modules are placed in parallel on a mother board or the like, much difference in temperature is caused among each of the modules, thus bringing about scattering of characteristic parameters (setup time, hold time and the like) of the memory elements that are installed on each of the modules. The scattering of characteristic parameters of the memory elements induces system malfunction. Further, if working frequency of memory elements further increases hereafter, there is also a danger of thermal breakage of memory elements.

SUMMARY OF THE INVENTION

An object of the present invention is to provide a heat radiation device for memory modules which is capable of efficiently radiating heat generated from a plurality of memory modules that are adjacently placed in parallel and at the same time, of uniformizing the temperature of each of the memory modules.

The heat radiation device for memory modules according to the present invention is a heat radiation device for memory modules intended for radiating heat generated from a memory module group wherein a plurality of memory modules equipped with memory elements on both the front and rear face sides of a substrate are placed in parallel. The device comprises heat radiation plates in pairs composed of front face side heat radiation plates in contact with memory elements that are installed on the front face side of the substrate for each of the memory modules, and of rear face side heat radiation plates in contact with memory elements that are installed on the rear face side of the substrate; and connecting members for heat radiation plates in pairs which connect the heat radiation plates in pairs that are installed per each of the memory modules. Accordingly, the heat generated from the memory elements is radiated from the surfaces of the heat radiation plates in contact with the memory elements, and is conducted to other heat radiation plates in pairs via the connecting member for the heat radiation plates in pairs, whereby the temperature of the entire memory module group is uniformized. As a result, the scattering of characteristic parameters is suppressed which is attributable to the temperature difference among the memory elements. Adhesivity to the memory elements can be enhanced by fixing the above-mentioned front and rear face side heat radiation plates by means of an optional fixing means or a bias means. It is also possible to enhance heat conduction efficiency by forming all of the front face side heat radiation plates, rear face side heat radiation plates and connecting members for the heat radiation plates in pairs out of the same material.

In the case where each of the memory modules which constitutes the memory module group is equipped with heat radiation plates in advance, the spacing of the above-mentioned heat radiation plates in pairs is set on the outside of the heat radiation plates so as to come into contact with the heat radiation plates. In this case, both the heat radiation effect due to the heat radiation plates with which the memory module is equipped in advance, and the heat radiation effect due to the heat radiation device for memory modules according to the present invention are obtainable without altering the memory modules at all.

The heat radiation effect can also be further enhanced by forming slits on the above-mentioned connection member for heat radiation plates in pairs.

The objects, characteristics and advantages of the present invention will become from the description mentioned below and the attached drawings which illustrate some examples of the present invention.

DESCRIPTION OF THE PREFERRED EMBODIMENTS

First Embodiment of the Present Invention

Figure 1:
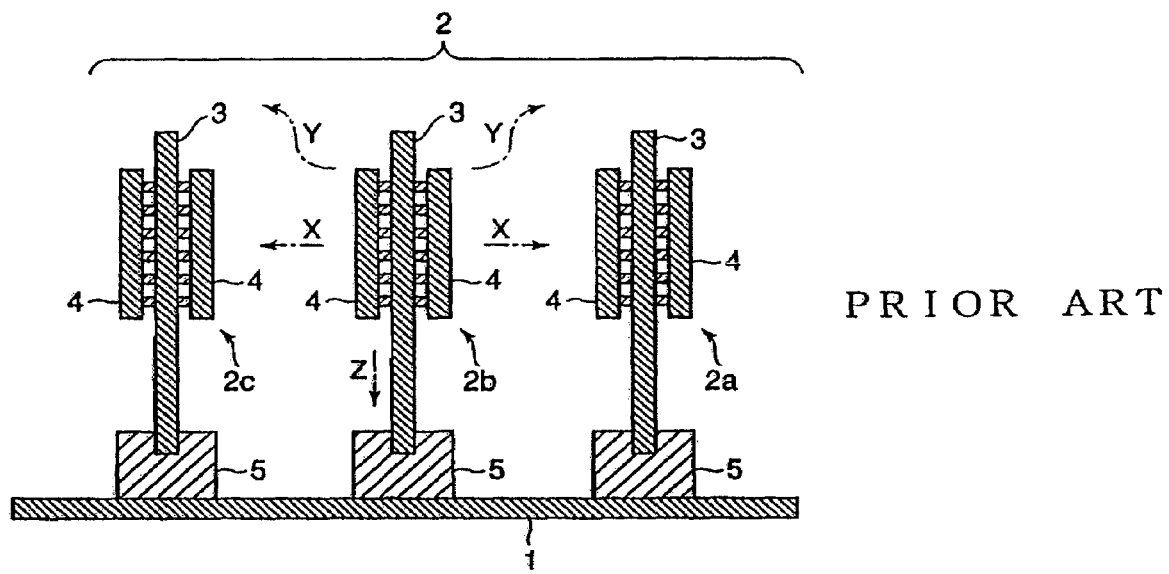
FIG. 1 is an enlarged cross-sectional view illustrating one example of a memory module group, representing the prior art.
Figure 2:
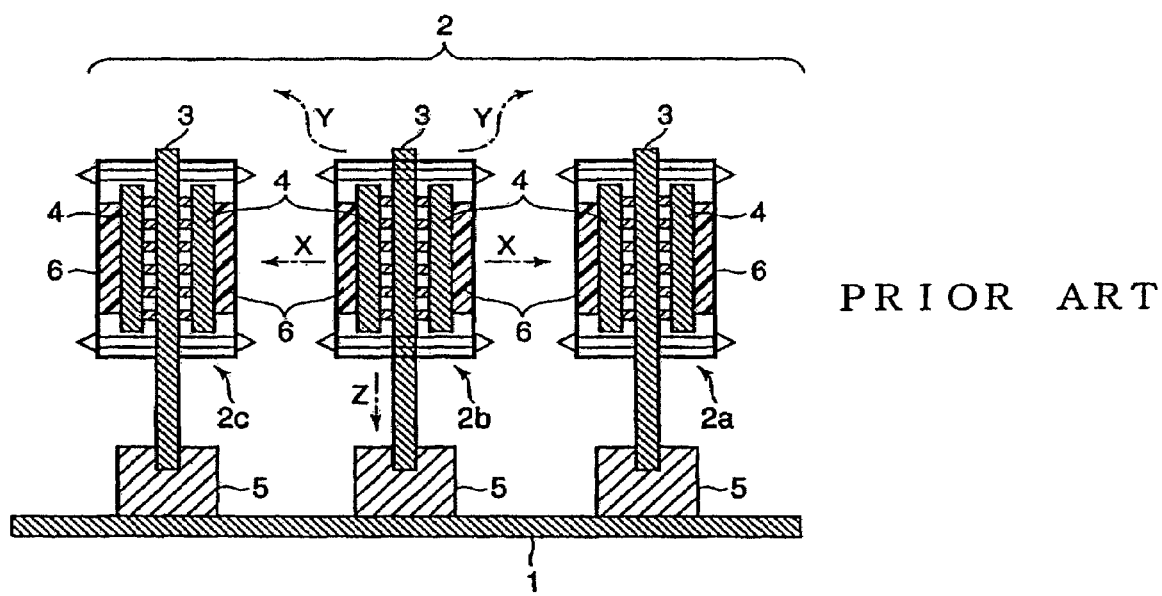
FIG. 2 is an enlarged cross-sectional view illustrating a memory module group which is constituted of memory modules each equipped with heat radiation plates, representing the prior art.
Figure 3:
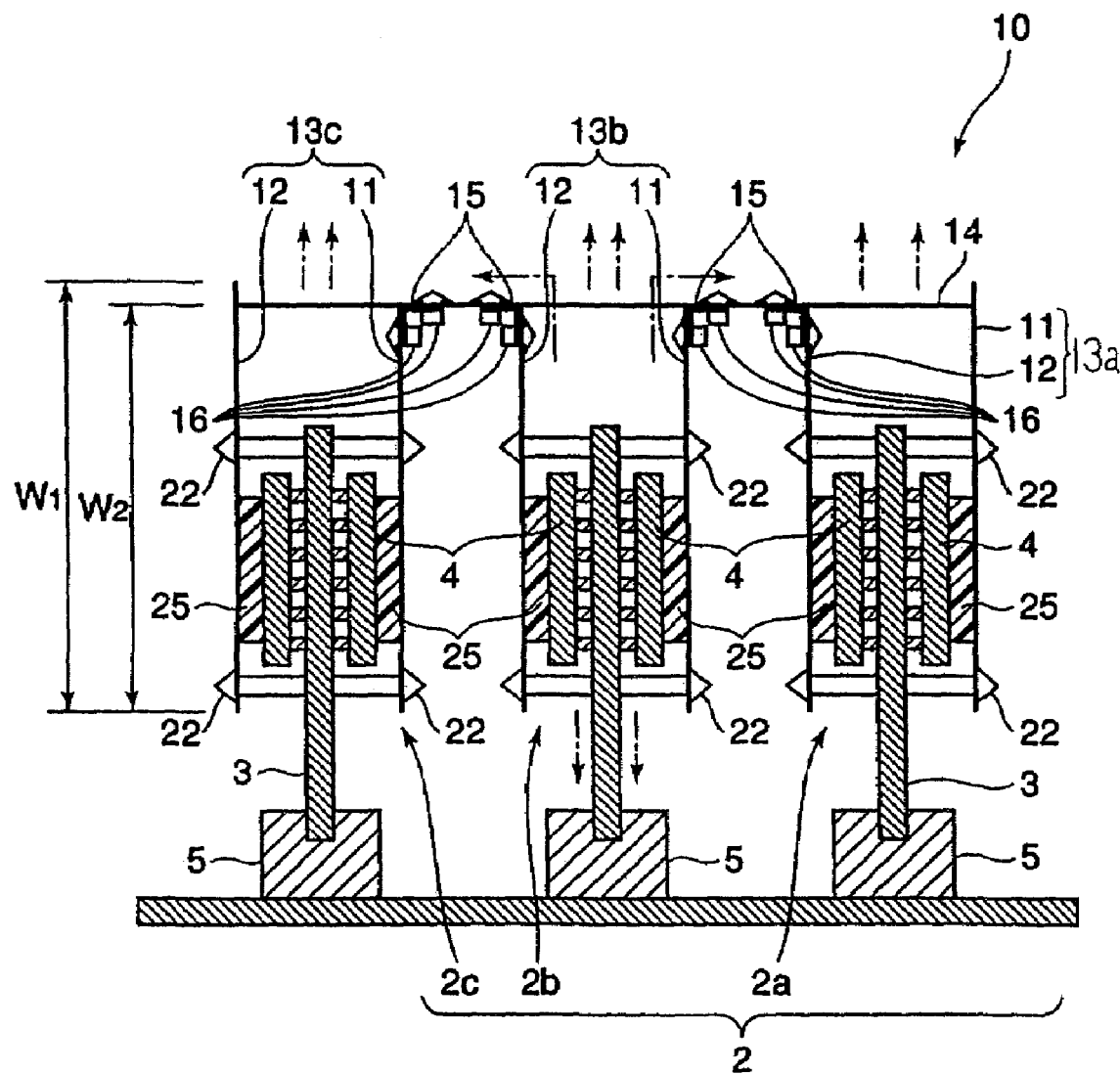
FIG. 3 is an enlarged cross-sectional view illustrating one example of an embodiment of a heat radiation device for memory modules according to the present invention.
Figure 4A:
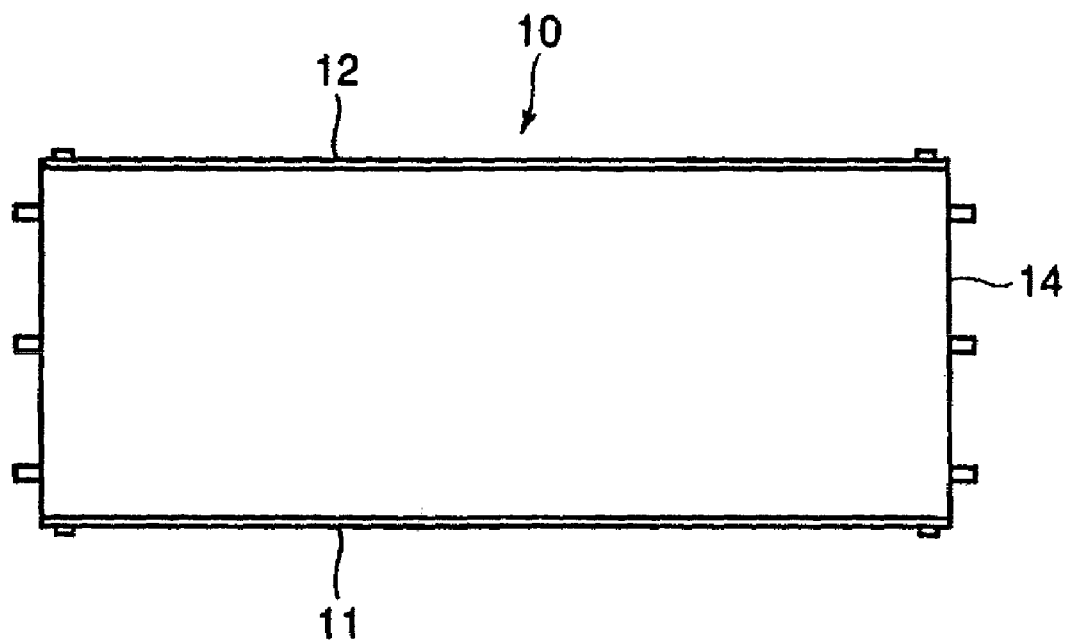
FIG. 4A is a plan view illustrating the heat radiation device for memory module as shown in FIG. 3.
Figure 4B:
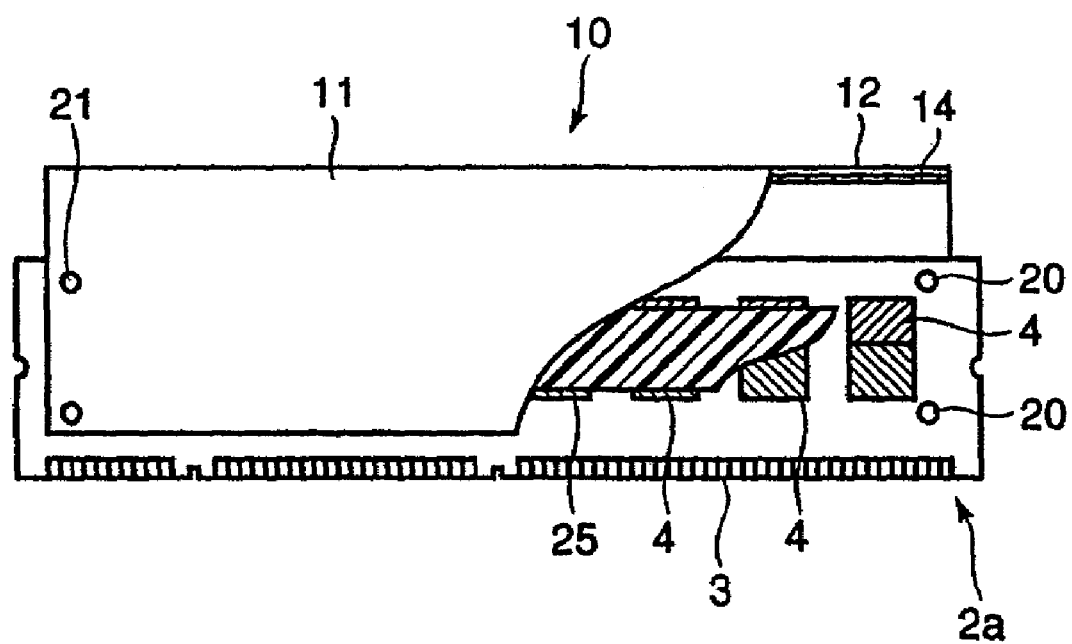
FIG. 4B is a partially cutaway side view illustrating the heat radiation device for memory module as shown in FIG. 3.

FIG. 3 is an enlarged cross-sectional view illustrating heat radiation device 10 for memory modules installed on memory module group 2 having three memory modules 2a to 2c according to the present invention. FIG. 4A is a plan view illustrating heat radiation device 10 for memory modules installed on memory module group 2 according to the present invention. FIG. 4B is a partially cutaway side view illustrating heat radiation device 10 for memory modules installed on memory module group 2 according to the present invention, wherein mother board 1 and connector 5 as illustrated in FIG. 3 are not shown in this drawing for the sake of convenience. Memory module group 2 and each of memory modules 2a to 2c which constitute memory module group 2, each shown in FIG. 3, have structures that are the same as those of the memory module group and the memory modules that are shown in FIG. 1. As such, the same structure is marked with the same symbol without repeating the same description. Among the outside faces of memory substrate in this example, the right side and left side faces in FIG. 3 are defined as front face and rear face, respectively, but the foregoing definition is nothing more than a definition for the sake of convenience.

As illustrated in detail in FIG. 3, heat radiation device 10 for memory modules according to the present invention has three heat radiation plates in pairs 13a to 13c each made up of front face side heat radiation plates 11 and rear face side heat radiation plates 12, opposite each other at a constant gap, and connection members 14 for heat radiation plates in pairs which connect three heat radiation plates in pairs 13a to 13c in order to integrate them. All of front face side heat radiation plates 11 and rear face side heat radiation plates 12, both constituting each of heat radiation plates in pairs 13a to 13c, are metallic thin sheets. Front face side heat radiation plate 11 for heat radiation plates in pairs 13a has a width ($W_1$) which is somewhat larger than the width ($W_2$) of opposing rear face side heat radiation plate 12. On the other hand, rear face side heat radiation plate 12 for heat radiation plates in pairs 13c has a width ($W_1$) which is somewhat larger than the width ($W_2$) of opposing front face side heat radiation plate 11. That is to say, in regard to heat radiation plates in pairs 13a and 13c, the relationship of the various sizes is reversed between front face side heat radiation plate 11 and rear face side heat radiation plate 12. In addition, front face side heat radiation plate 11 for heat radiation plates in pairs 13b and rear face side heat radiation plate 12 each have the same width, which is the same as the width ($W_2$) of rear face side heat radiation plate 12 for heat radiation plates in pairs 13a and the width ($W_2$) of front face side heat radiation plate 11 for heat radiation plates in pairs 13c.

As illustrated in FIG. 4B, communication holes 21 are opened at the upper and lower two positions on both ends in the longitudinal direction for all of front face side heat radiation plates 11 and rear face side heat radiation plates 12. When heat radiation device 10 for memory modules is installed on memory module group 2, each of communication holes 21 communicates with through holes 20 that are opened on substantially four corners of corresponding memory substrate 3.

Again reference is made to FIG. 3. The upper side face of front face side heat radiation plate 11 for heat radiation plates in pairs 13a protrudes upwardly by ($W_1$-$W_2$) from the upper end of rear face side heat radiation plate 12. The protruded upper side face of front face side heat radiation plate 11 for heat radiation plates in pairs 13a is assigned to the surface of either end in width direction of connection member 14 for heat radiation plates in pairs. The upper end surface of rear face side heat radiation plate 12 opposite to front face side heat radiation plate 11 at a prescribed gap is assigned to the rear face of connection member 14 for heat radiation plates in pairs. Further L—letter type fixing member 15 is assigned to a corner portion that is formed by contact between the upper end surface of rear face side heat radiation plate 12 and rear face of connection member 14 for heat radiation plates in pairs. Assigned fixing member 15 is fixed to rear face side heat radiation plate 12 and connection member 14 for heat radiation plates in pairs by means of a fastener (clip 16). Front face side heat radiation plate 11 and rear face side heat radiation plate 12 are each fixed to memory substrate 3 for memory module 2a by means of fixing tool 22 which is inserted into communication hole 21 of front face side heat radiation plate 11, through-hole 20 of memory substrate 3 and communication hole 21 of rear face side heat radiation plate 12, and front and rear side heat radiation plates 11 and 12 closely adhere to memory elements 4.

The upper side face of rear face side heat radiation plate 12 for heat radiation plates in pairs 13c protrudes upwardly by ($W_1$-$W_2$) from the upper end of front face side heat radiation plate 11. The protruded upper side face of rear face side heat radiation plate 12 is assigned to the surface of the other end in the width direction of connection member 14 for heat radiation plates in pairs. Moreover, front face side heat radiation plates 11 and connection member 14 for heat radiation plates in pairs are fixed with fixing member 15 and clip 16 as is the case with heat radiation plates in pairs 13a. In addition, front face side heat radiation plates 11 and rear face side heat radiation plates 12 are each fixed to memory substrate 3 for memory module 2c by means of fixing tool 22, and closely adhere to memory elements 4 as is the case with heat radiation plates in pairs 13a.

The upper end surfaces of front face side heat radiation plate 11 for heat radiation plates in pairs 13b and rear face side heat radiation plate 12 opposite to each other at a prescribed gap are each assigned to the rear face of connection member 14 for heat radiation plates in pairs. The upper end surfaces of front face side heat radiation plate 11 and rear face side heat radiation plate 12, both assigned to the rear surface of connection member 14 for heat radiation plates in pairs, are each fixed to connection member 14 for heat radiation plates in pairs by means of fixing member 15 and clip 16. Front face side heat radiation plate 11 and rear face side heat radiation plate 12 are each fixed to memory substrate 3 for memory module 2b by means of fixing tool 22, and closely adhere to memory elements 4 as is the case with heat radiation plates in pairs 13a and 13c.

As described hereinabove, when heat radiation device 10 for memory modules according to the present invention is installed on memory module group 2, each of heat radiation plates in pairs 13a to 13c cover corresponding memory modules 2a to 2c. Front face side heat radiation plates 11 and rear face side heat radiation plates 12 each for heat radiation plates in pairs 13a to 13c, which cover memory modules 2a to 2c are connected to each in order to integrate them. Further, front face side heat radiation plates 11 and rear face side heat radiation plates 12 each for heat radiation plates in pairs 13a to 13c are each brought into surface contact with the surface of memory elements 4 that are installed on opposite memory substrate 3, and closely adhere thereto.

According to the above-described structure, heat generated from any of the memory elements for any of memory modules is conducted to the front face side heat radiation plates or rear face side heat radiation plates each closely adhering to the memory elements, and is dispersed in the memory modules, and is conducted to other heat radiation plates in pairs via other connection members for heat radiation plates in pairs. As a result, heat generated from any of the memory elements for any of memory modules is dispersed in the memory module group so that the temperatures among the memory modules are uniformized. For instance, heat generated from memory element 4 installed on the front face of memory substrate 3 for memory module 2b shown in FIG. 3 is conducted to front face side heat radiation plate 11 for heat radiation plates in pairs 13b, is dispersed in the longitudinal direction of heat radiation plate 11, and is radiated from the front face of heat radiation plate 11. Likewise, heat generated from memory element 4 installed on the rear face of memory substrate 3 for the memory module 2b is conducted to rear face side heat radiation plate 12 for heat radiation plates in pairs 13b, is dispersed in the longitudinal direction of heat radiation plate 12, and is radiated from the surface of heat radiation plate 12. Further, heat conducted to front face side heat radiation plate 11 is conducted to connection member 14 for heat radiation plates in pairs, is radiated from the surface of connection member 14, and is mainly conducted to heat radiation plates in pairs 13a and also to memory module 2a. Further, heat conducted to rear face side heat radiation plate 12 is conducted to connection member 14 for heat radiation plates in pairs, is radiated from the surface of connection member 14, and is mainly conducted to heat radiation plates in pairs 13c and also to memory module 2c. As is the case with the prior art, heat generated from memory element 4 is conducted to mother board 1 via memory substrate 3 and connector 5, and is radiated from the surface of mother board 1. The above-described heat conduction state is schematically shown in FIG. 3 by the use of arrows with intermittent lines.

As illustrated in FIG. 3, when silicone grease 25 is applied between memory element 4 and front face side heat radiation plates 11/rear face side heat radiation plates 12 for each of heat radiation plates in pairs 13a to 13c, adhesivity between the surface of memory element 4 and front face side heat radiation plates 11/rear face side heat radiation plates 12 is improved, thereby enhancing heat conduction efficiency. Moreover, front face side heat radiation plates 11, rear face side heat radiation plates 12 and connection member 14 for heat radiation plates in pairs, when formed of the same material, bring about further enhanced heat conduction efficiency. A material to be selected in this case has preferably high heat conductivity, and is for example by copper (Cu) which is preferable. However, it is not an indispensable requirement of the present invention to form, with the same material, all of front face side heat radiation plates 11, rear face side heat radiation plates 12 and connection member 14 for heat radiation plates in pairs.

Figure 5:
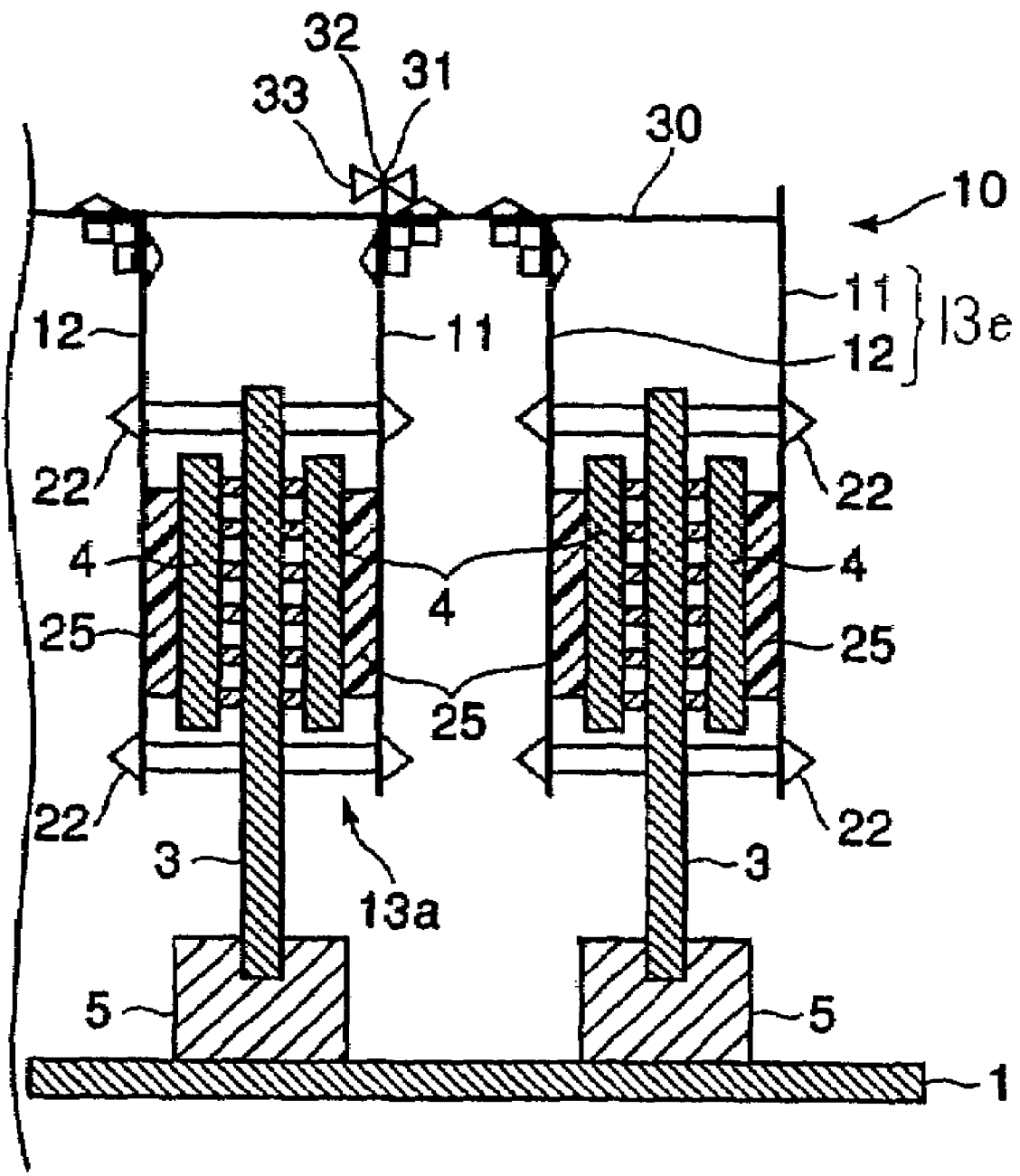
FIG. 5 is an enlarged cross-sectional view illustrating a heat radiation device for memory modules wherein heat radiation plates in pairs are extensionally provided.

The heat radiation plates in pairs can be properly added in accordance with the number of memory modules. FIG. 5 illustrates an example of added new heat radiation plates in pairs 13e on the right side of heat radiation plates in pairs 13a as shown in FIG. 3. Heat radiation plates in pairs 13e that are to be added have front face side heat radiation plate hand rear face side heat radiation plate 12 both being the same as those of heat radiation plates in pairs 13a, and are connected to heat radiation plates in pairs 13a with connection member 30 that is to be added having a width smaller than that of connection member 14 as shown in FIG. 3. Specifically one end in the width direction of connection member 30 that is to be added is upwardly folded and bent. Bent flexure 31 is assigned to protrusion 32 (the portion upwardly protruding from connection member 14) of front face side heat radiation plate 11 for heat radiation plates in pairs 13a. Assigned bent flexure 31 and protrusion 32 are fixed with connection fixing tool 33. The upper portion of front face side heat radiation plate 11 for heat radiation plates in pairs 13e whose portion protrudes higher than the connection member 30 that is to be added, functions in the same manner as protrusion 32 in the case of adding another heat radiation plates in pairs.

The fixing structure for front face side heat radiation plate 11/rear face side heat radiation plate 12, each constituting heat radiation plates in pairs 13e that is to be added and connection member 30 that is to be added, is the same as the fixing structure for front face side heat radiation plate 11/rear face side heat radiation plate 12 for heat radiation plates in pairs 13a and connection member 14 for heat radiation plates in pairs. Likewise, the fixing structure for front face side heat radiation plate 11/rear face side heat radiation plate 12 each constituting heat radiation plates in pairs 13e that is to be added and memory substrate 3, is the same as the fixing structure for front face side heat radiation plate 11/rear face side heat radiation plate 12 for heat radiation plates in pairs 13a and memory substrate 3.

Second Embodiment of the Present Invention

Figure 6:
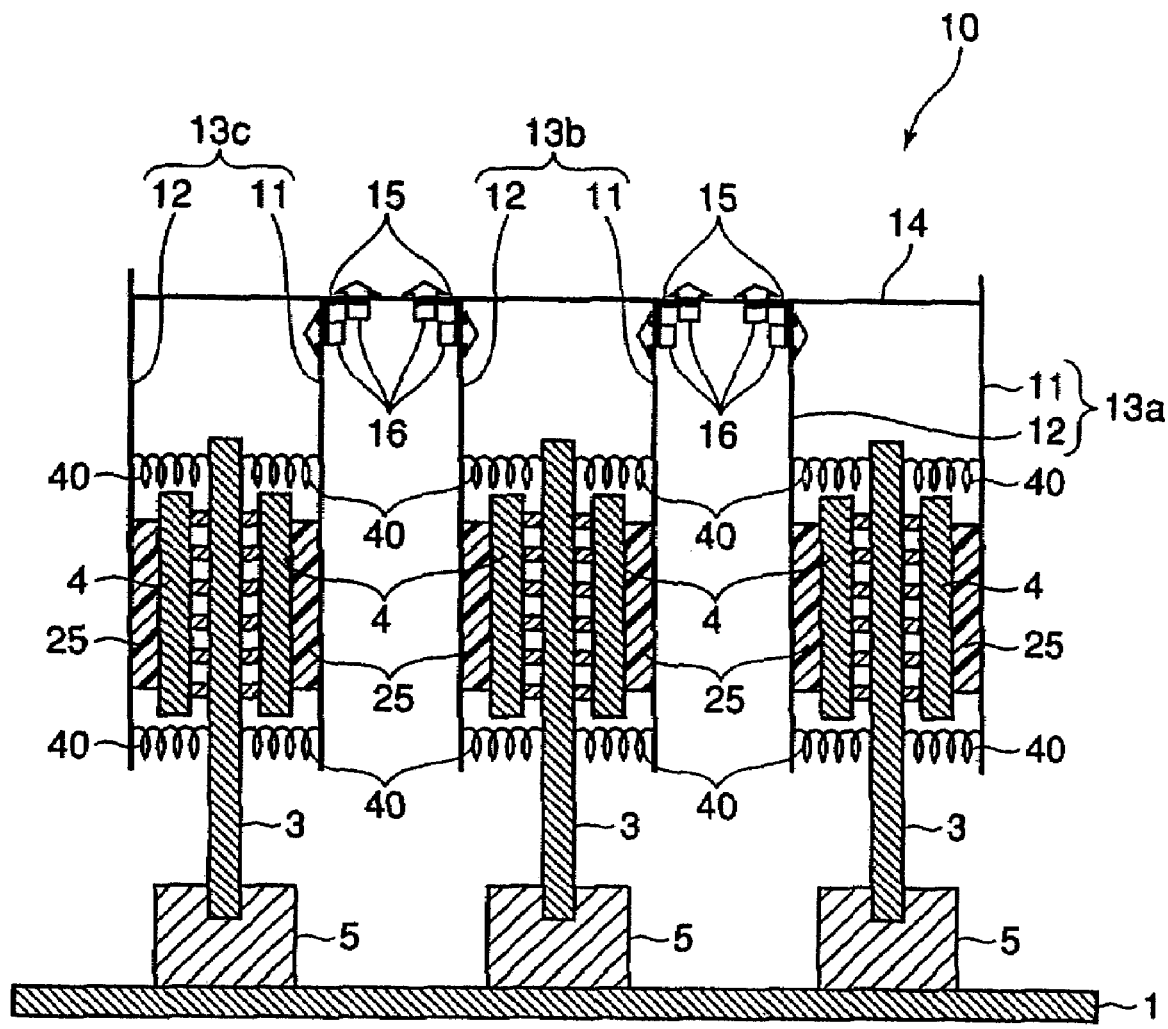
FIG. 6 is an enlarged cross-sectional view illustrating another example of an embodiment of a heat radiation device for memory modules according to the present invention.

Another embodiment of a heat radiation device for memory modules according to the present invention is illustrated in FIG. 6. The fundamental structure of heat radiation device 10 for memory modules shown in FIG. 6 is the same as that of heat radiation device 10 for memory modules shown in FIG. 3. The same structure is marked with the same symbols without repeating the same description, but a description is made only for different structures.

In regard to heat radiation device 10 for memory modules shown in FIG. 6, front face side heat radiation plates 11/rear face side heat radiation plates 12, each constituting heat radiation plates in pairs 13a to 13c and memory substrates 3, are connected by an elastic body (spring 40). Thereby front face side heat radiation plates 11 and rear face side heat radiation plates 12 are attracted to the opposite side of memory substrates 3, and closely adhere to the surfaces of memory elements 4 on memory substrates 3.

In regard to heat radiation device 10 for memory modules shown in FIG. 3, front face side heat radiation plates 11/rear face side heat radiation plates 12 and memory substrates 3 are fixed by the use of fixing tool 22 in the form of a pin. On the other hand, regarding heat radiation device 10 for memory modules shown in FIG. 6, a fixing means corresponding to fixing tool 22 shown in FIG. 3 is made unnecessary, though fixing tool 22 shown in FIG. 3 and spring 40 shown in FIG. 6 can be used in combination. In this case, when the communication holes for front face side heat radiation plates 11, through-holes for memory substrates 3, communication holes for rear face side heat radiation plates 12 and fixing tools 22, are in a free state without being fixed, fixing tool 22 functions as a regulating means for regulating the dislocation of front face side heat radiation plates 11, rear face side heat radiation plates 12 and memory substrates 3 without at all impairing the function due to the bias of spring 40.

Third Embodiment of the Present Invention

Figure 7:
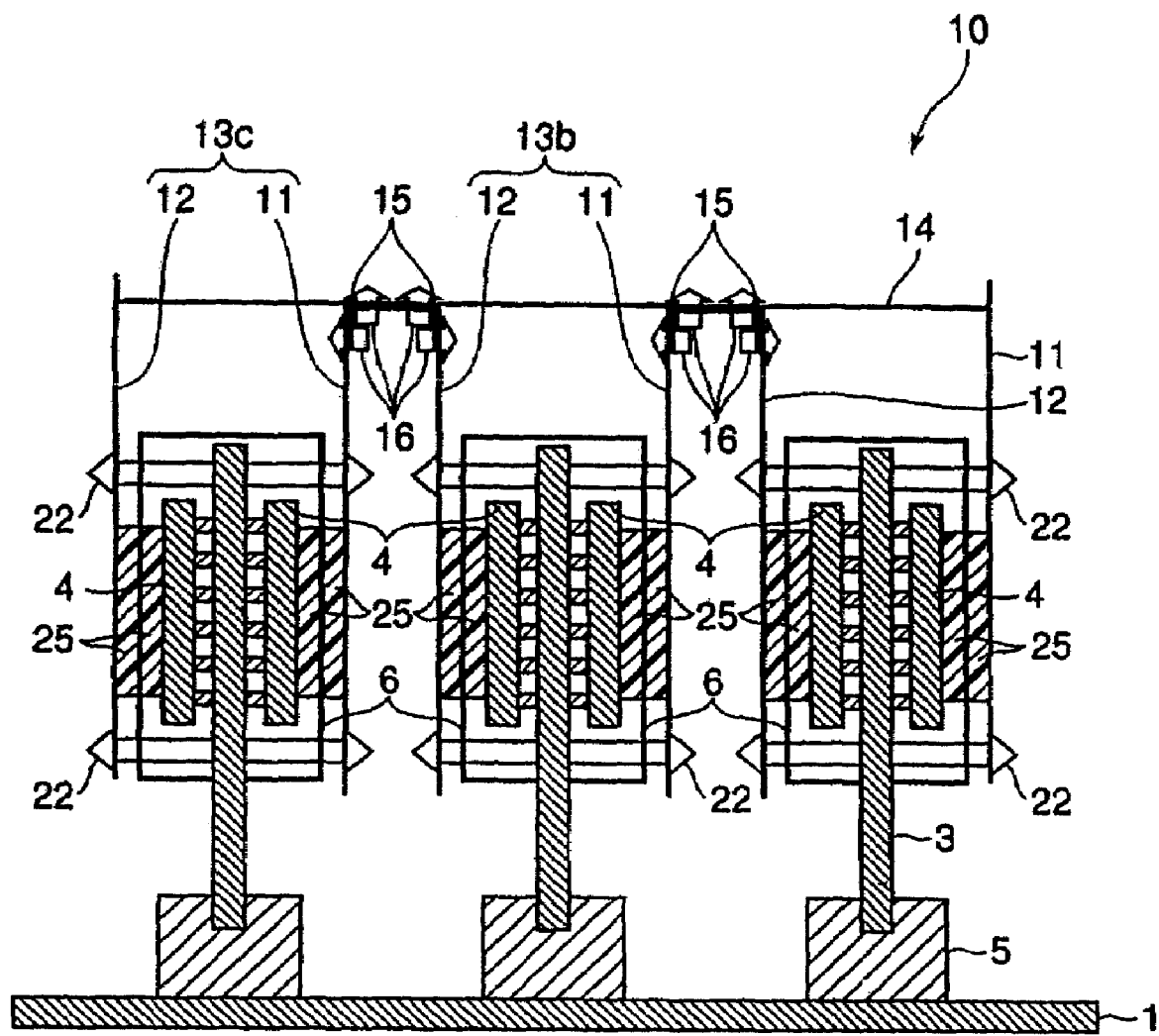
FIG. 7 is an enlarged cross-sectional view illustrating another example of an embodiment of a heat radiation device for memory modules according to the present invention.

Another embodiment of a heat radiation device for memory modules according to the present invention is illustrated in FIG. 7. The fundamental structure of heat radiation device 10 for memory modules shown in FIG. 7 is the same as that of heat radiation device 10 for memory modules shown in FIG. 3. The same structure is marked with the same symbols without repeating the same description, but a description is made only for different structures.

The memory module shown in FIG. 7 is characterized mainly by an improvement that enables each of memory modules 2a to 2c to be installed on memory module group 2 equipped in advance with heat radiation plate 6. Specifically, the gap between front face side heat radiation plates 11 and rear face side heat radiation plates 12 each constituting radiation plates in pairs 13a to 13c is increased by a necessary and sufficient degree as compared with heat radiation plates in pairs 13a to 13c shown in FIG. 3.

Thereby, it is possible to cover heat radiation plates 6 each installed on memory modules 2a to 2c from outside with heat radiation plates in pairs 13a to 13c. More specifically, when heat radiation plates in pairs 13a to 13c are made to cover corresponding memory modules 2a to 2c, each of front face side heat radiation plates 11 and rear face side heat radiation plates 12 adheres to heat radiation plates 6 for memory modules 2a to 2c. When silicone grease 25 is applied between each of front face side heat radiation plates 11 and rear face side heat radiation plates 12 and each of heat radiation plates 6, the adhesion therebetween is further enhanced and thus heat conductivity is further improved.

Fourth Embodiment of the Present Invention

Figure 8:
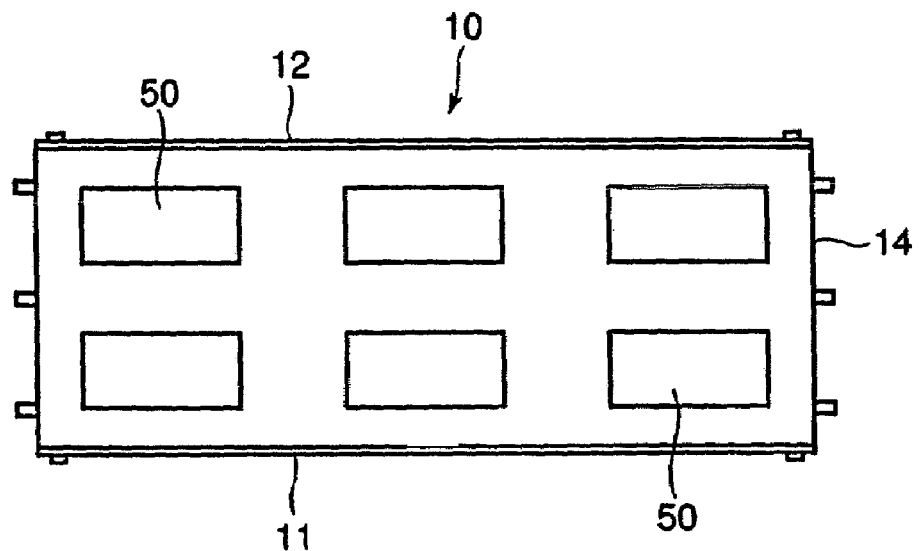
FIG. 8 is a plan view illustrating another example of an embodiment of a heat radiation device for memory modules according to the present invention.

It is possible to form at least one slit 50 as shown in FIG. 8 on the connection member for heat radiation plates in pairs which constitutes the heat radiation device for memory modules, the device being described in the first to third embodiments of the invention. In the case of forming slit 50, the heat that is generated mainly from front face side heat radiation plates 11 and rear face side heat radiation plates 12 becomes more prone to be radiated to the outside of heat radiation device 10 for memory modules, thereby further enhancing the heat radiation effect. Each of slits 50 shown in FIG. 8 measures 5.0 by 10.0 mm, but slits 50 is not restricted to the form, shape, size, dimension and arrangement as shown in the drawings.

In the following, a description will be given of one example of a test which was carried out in order to confirm the working effect of the heat radiation device for memory modules according to the present invention. In this test, the following three specimens were prepared.

Specimen 1: memory module group equipped with the heat radiation device for memory modules according to the present invention as shown in FIG. 3

Specimen 2: memory module group equipped with a heat radiation device for memory modules different from that of the present invention.

Specimen 3: memory module group not equipped with any heat radiation device for memory modules (memory module group shown in FIG. 1).

Figure 9:
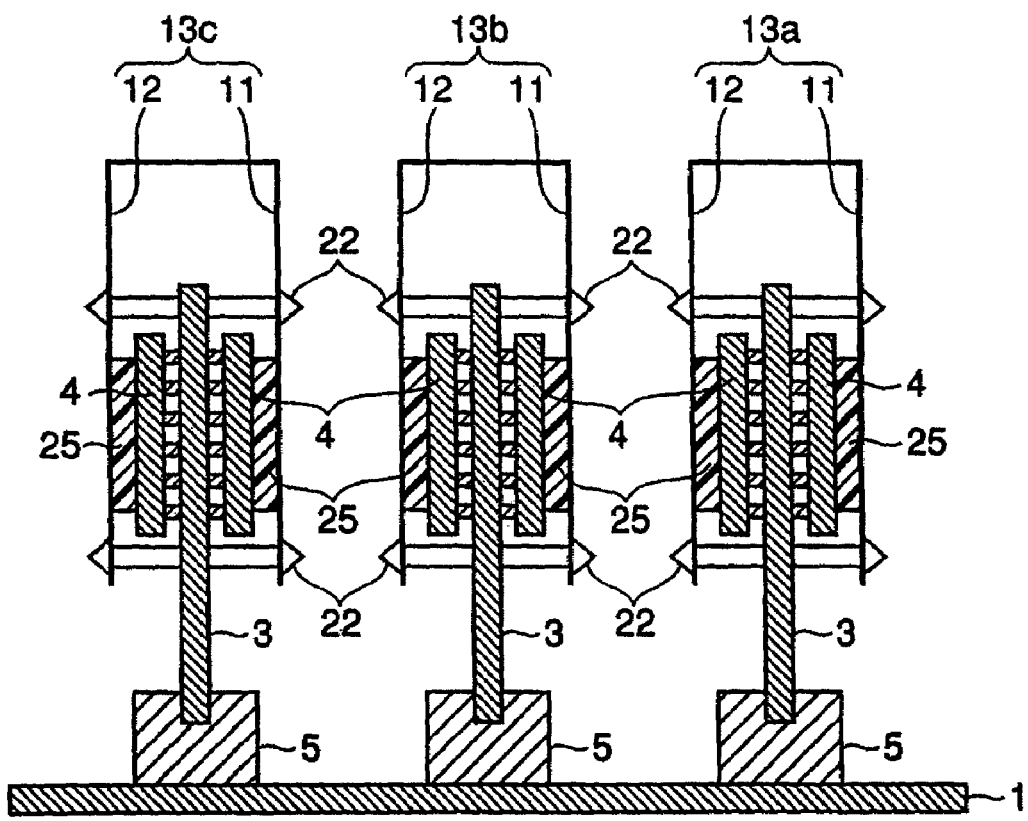
FIG. 9 is an enlarged cross-sectional view of a heat radiation device for memory modules for comparison with the device of the present invention.

The structure of the heat radiation device for memory modules of specimen 2, is shown in FIG. 9. This heat radiation device for memory modules has a structure which is the same as that of heat radiation device 10 for memory modules as shown in FIG. 3 except that it is not equipped with connection member 14 for heat radiation plates in pairs installed on heat radiation device 10 for memory module as shown in FIG. 3 (the heat radiation device for memory modules according to the present invention), and those of each of heat radiation plates in pairs 13a to 13c are independent.

Conditions and Details of the Test are as Follows

Each memory module 2a to 2c: capacity 1 GB Unb-DIMM

Memory elements 4: DDR SDRAM 512 Mbit×8×2 (total number of 16)

Single body package: TSOP

Number of modules: 3 (three plug in)

Working frequency of memory element 4: DDR 333 [MHz]

Environment: natural convection

Gap between adjacent connector: 11.0 mm

Gap between modules 2a to 2c (DIMM gap): 5.0 mm

Materials of construction for heat radiation plates in pairs 13a to 13c and connection member 14 for heat radiation plates in pairs: copper Height of memory substrates 3 (distance from mother board 1 to substrate 3): 30.48 mm Height of heat radiation plates in pairs 13a to 13c: 50.8 mm (distance from mother board 1 to connection member 14 for heat radiation plates in pairs)

Object of measurement: Memory elements 4 having highest temperature are to be installed on central memory module 2b.

{Test 1}

On the assumption that either the front or rear elements of memory elements 4 which are installed on both front and rear face side of memory substrate 3 are used, power consumption of each of memory modules for specimens 1 to 3 was set as follows.

memory module 2b: eight memory elements installed on the front face of memory substrate: 542 [mW]
eight memory elements installed on the front face of memory substrate: 58 [mW]
memory modules 2a and 2c: all of 16 memory elements: 58 [mW]

Highest temperatures of memory elements 4 for memory module 2b of specimens 1 to 3 were measured under the foregoing conditions. The following results were obtained.

Specimen 1: 59.8° C.
Specimen 2: 63.3° C.
Specimen 3: 80.5° C.

It has been confirmed that specimen 1 (heat radiation device 10 for memory modules according to the present invention) has a high cooling effect of about 4.0° C. (63.3-59.8) as compared with the heat radiation device for memory module according to specimen 2 in which each of the heat radiation plates is independent.

{Test 2}

On the assumption that memory elements 4 installed on both the front and rear face side of memory substrates 3 alternately function, power consumption of each of memory modules for specimens 1 to 3 was set as follows.

memory module 2b: eight memory elements installed on the front face of memory substrate: 300 [mW]
:eight memory elements installed on the front face of memory substrate: 300 [mW]
memory modules 2a and 2c: all of the 16 memory elements: 58 [mW]

Highest temperatures of memory elements 4 for memory module 2b of specimens 1 to 3 were measured under the foregoing conditions. The following results were obtained.

Specimen 1: 58.4° C.
Specimen 2: 62.4° C.
Specimen 3: 75.1° C.

As is the case with test 1, it has been confirmed that specimen 1 (heat radiation device 10 for memory module according to the present invention) has a high cooling effect of about 4.0° C. (62.4-58.4) as compared with the heat radiation device for memory module according to specimen 2 in which each of the heat radiation plates is independent.

Furthermore, measurements were made of the highest temperatures of the memory elements for the memory module groups on which heat radiation device 10 for memory module, according to the present invention as shown in FIG. 8, was installed under the same conditions as in this test. As a result, the highest temperature of the memory elements installed on the central memory module was 57.6° C. Thereby, it has been confirmed that a further cooling effect of about 1.0° C. is exhibited by forming slits 50 on connection member 14 for heat radiation plates in pairs.

Although the embodiments selected from the present invention are described by the use of specific terminology, it should be understood that this is done solely by way of example, and that change and modification may be made without departing from the scope and spirit of the claims as described hereunder.

The invention claimed is:

1. A memory module assembly, comprising:
a plurality of memory modules each equipped with a substrate and memory elements disposed on both of main surfaces of the substrate, wherein said memory modules are arranged in parallel so that said memory modules be installed on a mother board by mounting peripheral sides of said substrates to corresponding connectors provided on the mother board;
plural pairs of heat radiation plates provided correspondingly to said plurality of memory modules so that each memory module is put between the corresponding pair of the heat radiation plates and said memory elements are thermally coupled to the corresponding heat radiation plate, respectively, wherein said plural pairs are arranged spacedly from each other so that the heat radiates from the faces of the heat radiation plates to the air between the neighboring memory modules;
a connecting member disposal at, and thermally coupled to, said heat radiation plates at the peripheral side opposite to said peripheral side to be inserted to the corresponding connector so that the heat generated at the memory elements is conducted from the heat radiation plates, with which the memory elements are thermally coupled, to the other heat radiation plates via said connecting member; and
fixing means arranged to fix the corresponding pair of heat radiation plates by being inserted there through so that said radiation plates closely adhere to the corresponding memory elements.

2. A memory module assembly of claim 1,
wherein each of said heat radiation plates includes a protruding portion which protrudes beyond an extent of the substrate of the corresponding memory module at the peripheral side opposite to said peripheral side to be inserted to the corresponding connector,
wherein said connecting member is disposed at, and thermally coupled to, said heat radiation plates at said protruding portions.

3. A memory module assembly of claim 1, wherein the connecting member is exposed to the air at the surface opposite to the surface facing to the memory modules.

4. A memory module assembly of claim 1, further comprising force-applying means engaged to the corresponding heat radiation plates so that each pair of said radiation plates closely adhere to the memory elements.

5. A memory module assembly of claim 1, further comprising a pair of inner heat radiation plates installed on each of the memory modules so that each inner heat radiation plate is positioned between, and thermally coupled to, a corresponding memory element and a corresponding heat radiation plate.

6. A memory module assembly of claim 1, wherein said heat radiation plates as well as said connecting member are formed of the same material.

7. A memory module assembly of claim 1, wherein said connecting member is provided with plural slits so that the air flows between the heat radiation plates.

8. A memory module assembly of claim 1, wherein the connecting member includes copper.

9. A memory module assembly of claim 4, wherein said force applying means includes a spring.

10. A memory module assembly, comprising:
a plurality of memory modules each equipped with a substrate and memory elements disposed on both of main surfaces of the substrate;
plural pairs of heat radiation plates provided correspondingly to said plurality of memory modules, each memory module being put between the corresponding pair of the heat radiation plates and said memory elements being thermally coupled to the corresponding heat radiation plate, respectively;

a connecting member coupled to pairs of heat radiation plates of the neighboring memory modules installed on a mother board to be inserted to corresponding connectors; and fixing means arranged to fix the corresponding pair of heat radiation plates by being inserted there through so that radiation plates closely adhere to the corresponding memory elements.

11. A memory module assembly of claim 10, wherein each of said heat radiation plates includes a protruding portion which protrudes beyond an extent of the substrate of the corresponding memory module at the peripheral side opposite to said peripheral side to be inserted to the corresponding connector, wherein said connecting member is disposed at, and thermally coupled to, said heat radiation plates at said protruding portions.

12. A memory module assembly of claim 10, wherein the connecting member is exposed to the air at the surface opposite to the surface facing to the memory modules.

13. A memory module assembly of claim 1, further comprising force-applying means engaged to the corresponding heat radiation plates so that each pair of said radiation plates closely adhere to the memory elements.

14. A memory module assembly of claim 10, further comprising a pair of inner heat radiation plates installed on each of the memory modules so that each inner heat radiation plate is positioned between, and thermally coupled to, a corresponding memory element and a corresponding heat radiation plate.

15. A memory module assembly of claim 1, wherein said heat radiation plates as well as said connecting member are formed of the same material.

16. A memory module assembly of claim 1, wherein said connecting member is provided with plural slits so that the air flows between the heat radiation plates.

17. A memory module assembly of claim 1, wherein the connecting member includes copper.

18. A memory module assembly of claim 13, wherein said force-applying means includes a spring.

19. A memory module assembly, comprising:

a plurality of memory modules each equipped with a substrate and memory elements disposed on both of main surfaces of the substrate;

plural pairs of heat radiation plates provided correspondingly to said plurality of memory modules, the memory module being put between the corresponding pair of the heat radiation plates and said memory elements being thermally coupled to the corresponding heat radiation plate, respectively, a connecting member coupled to at least two pairs of heat radiation plates of the neighboring memory modules installed on a mother board to be inserted to corresponding connectors; and fixing means arranged to fix the corresponding pair of heat radiation plates by being inserted there through so that radiation plates closely adhere to the corresponding memory elements.

* * * * *